United States Patent
Sone

(10) Patent No.: US 6,200,431 B1
(45) Date of Patent: *Mar. 13, 2001

(54) REACTIVE SPUTTERING APPARATUS AND PROCESS FOR FORMING THIN FILM USING SAME

(75) Inventor: Kazuho Sone, Chiba (JP)

(73) Assignee: Canon Kabushiki Kaisha, Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/025,747

(22) Filed: Feb. 18, 1998

(30) Foreign Application Priority Data

Feb. 19, 1997 (JP) .................................................. 9-035125
Feb. 26, 1997 (JP) .................................................. 9-042181

(51) Int. Cl.$^7$ .................................................. C23C 14/34
(52) U.S. Cl. .............................. 204/192.12; 204/298.07; 204/298.11
(58) Field of Search ........................ 204/298.07, 298.11, 204/298.26, 192.12, 298.28

(56) References Cited

U.S. PATENT DOCUMENTS

| | | | |
|---|---|---|---|
| 4,572,842 | * 2/1986 | Dietrioh et al. | 204/192.12 |
| 4,824,544 | * 4/1989 | Mikaloon et al. | 204/192.12 |
| 4,931,158 | * 6/1990 | Bunshah | 204/192.12 |
| 5,330,628 | * 7/1994 | Demaray et al. | 204/192.12 |
| 5,380,414 | * 1/1995 | Tepman | 204/192.12 |
| 5,415,753 | * 5/1995 | Hurwitt et al. | 204/192.12 |
| 5,741,404 | * 4/1998 | Cathey | 204/192.12 |
| 5,807,467 | * 9/1998 | Givens et al. | 204/192.12 |

FOREIGN PATENT DOCUMENTS

| | | |
|---|---|---|
| 58-110673 | 7/1983 | (JP) . |
| 62-056570 | 3/1987 | (JP) . |
| 6-041733 | 2/1994 | (JP) . |
| 7-335553 | 12/1995 | (JP) . |

OTHER PUBLICATIONS

M. Alex, et al., "DC–Reactive Sputtering of $Al_1O_3$," Proceedings of The Second International Symposium on Sputtering & Plasma Processes, 1993, pp. 269–274.

* cited by examiner

Primary Examiner—Nam Nguyen
Assistant Examiner—Gregg Cantelmo
(74) Attorney, Agent, or Firm—Fitzpatrick, Cella, Harper & Scinto

(57) ABSTRACT

To form a large-area thin film having in-plane uniform thickness and optical and electrical characteristics at a high deposition rate, a reactive sputtering apparatus is provided which comprises a substrate holding means for holding a substrate, a target holding means for holding a target, a sputter gas supplying means for supplying into a reaction chamber a sputter gas for sputtering the target, a reactive gas supplying means for supplying a reactive gas, and a power supplying means for supplying a power for causing a discharge to take place between the target and the substrate, wherein a partition member having a plurality of openings is provided between the target and the substrate, and wherein a supply port and an exhaust passage both for the sputter gas and a supply port and an exhaust passage both for the reactive gas are provided separately from each other such that the sputter gas is applied to and exhausted from a space between the target and the partition member and the reactive gas is applied to and exhausted from a space between the substrate and the partition member.

17 Claims, 8 Drawing Sheets

REACTIVE SPUTTERING APPARATUS AND PROCESS FOR FORMING THIN FILM USING SAME

BACKGROUND OF THE INVENTION

1. Field of the Invention

This invention relates to a reactive sputtering apparatus, and more particularly belongs to the technical field of thin-film forming processes suited for forming electrodes or protective films for semiconductor elements, electrodes or protective films for liquid-crystal devices, protective films for photomagnetic recording media, reflection preventive films (including anti-reflection coating films) or reflection enhancing films for optical articles, or the like by the use of such an apparatus.

2. Related Background Art

Conventional reactive sputtering is a process in which a mixed gas of a sputter gas and a reactive gas is introduced into a reaction chamber and a metallic target is sputtered to form a metallic compound thin film by a chemical reaction of constituent atoms of the target with the reactive gas. In this instance, the reactive gas may react with the metallic target on the target surface to form a metallic compound on the target surface. Usually, since the sputtering yield with respect to a metallic compound is about 10% of that with respect to the metal, the deposition rate may lower in the reactive sputtering. If the reactive gas is fed at a lower flow rate in order to improve the yield, the metallic compound thin film may be formed as having a higher content of metallic atoms, and can not possibly be a thin film that satisfies the stoichiometric ratio, resulting in poor thin-film characteristics in respect of optical characteristics (such as refractive index and transmittance) and so forth.

Accordingly, some attempts to solve such technical problems are proposed.

FIG. 8 is a schematic view of a reactive sputtering apparatus disclosed in Japanese Patent Application Laid-Open No. 62-56570. Reference numeral 1 denotes a target; 2, a substrate; 3, a supply pipe for argon (Ar) serving as a sputter gas; 4, a supply pipe for oxygen ($O_2$) serving as a reactive gas; 9, a reaction chamber; 12, a target holder; and 7, a substrate holder.

The above publication states that the use of the apparatus shown in FIG. 8 makes the rate of sputtering larger and brings about an improvement in the characteristics of the oxides, since the sputter gas and the reactive gas are separately introduced, and since the sputtering takes place preferentially in the vicinity of the target and the oxidation reaction takes place preferentially in the vicinity of the substrate.

In reality, however, the sputter gas and the reactive gas mix at a zone between the target and the substrate to form a mixed plasma of both. Especially when a thin film is formed on a large-area substrate, the discharging region between the substrate and the target is so large that the sputter gas and the reactive gas can be separately present with difficulty. Thus, the film quality and the rate of sputtering can not be so much improved as expected.

Meanwhile, FIG. 9 is a schematic view of a reactive sputtering apparatus disclosed in Japanese Patent Application Laid-Open No. 6-41733. Reference numeral 1 denotes a target; 2, a substrate; 3, a supply pipe for argon (Ar) serving as a sputter gas; 4, a supply pipe for oxygen ($O_2$) serving as a reactive gas; 7, a substrate holder; 8, a power source; 9, a reaction chamber; 12, a target holder; 13, a differential pressure plate; 14, a high frequency power source; 15, a coil; 16, a magnet; 17, a pipe for circulating a refrigerant; and 18, an exhaust pump.

In this apparatus, an exhaust vent communicating with a vacuum pump is provided at an upper part of the reaction chamber 9, and the differential pressure plate 13 is utilized to produce a difference in pressure between the reaction chamber upper part and the reaction chamber lower part so that the sputter gas and the reactive gas can be separated.

Japanese Patent Application Laid-Open No. 7-335553 discloses a reactive sputtering apparatus proposed in order to achieve an object different from the object of the above apparatuses. This apparatus is provided with a collimator between the target and the substrate in order to fill up contact holes of semiconductor devices.

The specification and drawings of U.S. Pat. No. 5,415,753 and a publication "THE SECOND INTERNATIONAL SYMPOSIUM ON SPUTTERING & PLASMA PROCESSES, 1993, pp. 269–274" also disclose a reactive sputtering apparatus provided with a perforated plate between a target and a substrate and so constructed that a sputter gas and a reactive gas are separately fed.

In the apparatus shown in FIG. 9, however, an opening 13a of the differential pressure plate 13 is larger in size than the substrate 2, so that, in reality, the sputter gas will undesirably pass through the opening 13a of the differential pressure plate 13 to flow to the substrate 2 side. Hence, also in such an apparatus, the rate of sputtering and the film quality can not be so much improved as expected.

The apparatus disclosed in U.S. Pat. No. 5,415,753 has also no sufficient countermeasure for gas exhaustion, and the rate of sputtering and the film quality can not be so much improved as expected.

SUMMARY OF THE INVENTION

An object of the present invention is to provide a reactive sputtering apparatus, and a thin film forming process, that can form a thin film having in-plane uniform thickness and optical and electrical characteristics.

Another object of the present invention is to provide a reactive sputtering apparatus, and a thin film forming process, that can form a uniform and large-area thin film at a high deposition rate.

The present invention provides a reactive sputtering apparatus comprising a substrate holding means for holding a substrate, a target holding means for holding a target, a sputter gas supplying means for supplying into a reaction chamber a sputter gas for sputtering the target, a reactive gas supplying means for supplying a reactive gas, and a power supplying means for supplying a power for causing a discharge to take place between the target and the substrate, wherein;

a partition member having a plurality of openings is provided between the target and the substrate, a first space being formed between the target and the partition member, and a second space being formed between the substrate and the partition member;

a sputter gas supply port for supplying the sputter gas to the first space and an exhaust passage for exhausting at least part of the sputter gas from the first space without passing through the plurality of openings are provided in the first space; and a reactive gas supply port for supplying the reactive gas to the second space and an exhaust passage for exhausting at least part of the reactive gas from the second space without passing through the plurality of openings are provided in the second space.

The present invention also provides a thin film forming process for forming a thin-film using a reactive sputtering apparatus comprising a substrate holding means for holding a substrate, a target holding means for holding a target, a sputter gas supplying means for supplying into a reaction chamber a sputter gas for sputtering the target, a reactive gas supplying means for supplying a reactive gas, and a power supplying means for supplying a power for generating a discharge between the target and the substrate, the process comprising the steps of;

disposing the substrate and the target such that a partition member having a plurality of openings is interposed therebetween;

supplying the sputter gas to a first space between the target and the partition member and exhausting at least part of the sputter gas from the first space without passing through the plurality of openings;

supplying the reactive gas to a second space between the substrate and the partition member and exhausting at least part of the reactive gas from the second space without passing through the plurality of openings; and generating a discharge between the target and the substrate, thereby forming on the substrate a thin film containing the constituent atoms of the target and the constituent atoms of the reactive gas.

According to the present invention, the flow of the sputter gas and the flow of the reactive gas are separated from each other by the partition member as a boundary. Thus, the plasma of the sputter gas preferentially acts to sputter the target, and hence does not damage the depositing surface on the substrate. On the other hand, since the reactive gas reacts, on the depositing surface, preferentially with the sputtered constituent atoms of the target, an excess or a deficiency of the reactive gas component (e.g., oxygen, nitrogen or fluorine) does not occur, so that a good compound thin film can be formed. Further, since the reaction of the target with the reactive gas can be restrained, the sputtering rate of the target can be increased, thus improving the deposition rate.

DESCRIPTION OF THE PREFERRED EMBODIMENTS

Figure 1:
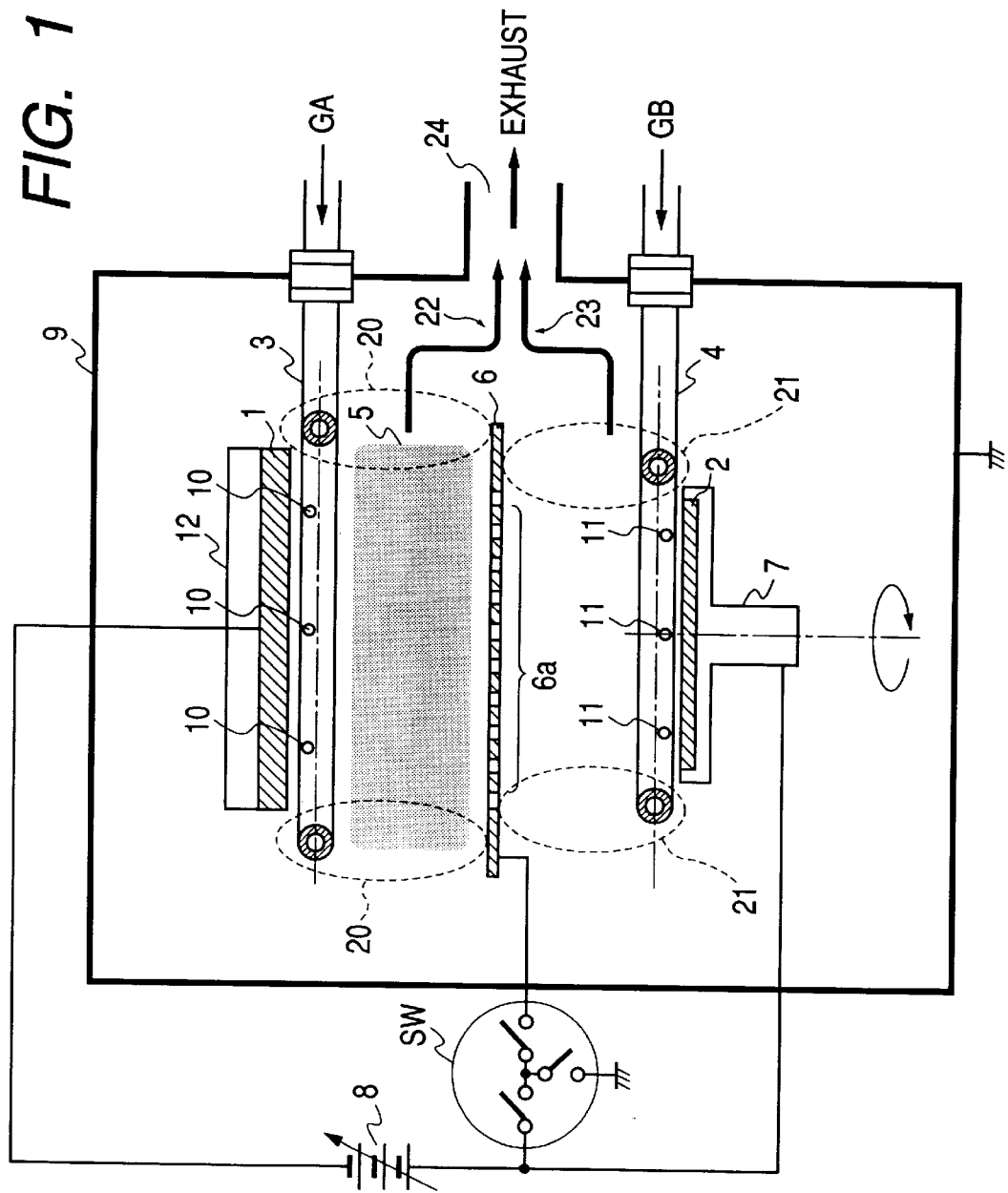
FIG. 1 is a schematic sectional view of a reactive sputtering apparatus according to a preferred embodiment of the present invention.

FIG. 1 is a schematic sectional view of a reactive sputtering apparatus according to a preferred embodiment of the present invention.

(Reactive Sputtering Apparatus)

The reactive sputtering apparatus as shown in FIG. 1 has a substrate holder 7 as a substrate holding means for holding a substrate 2, a target holder 12 as a target holding means for holding a target 1, a gas shower head 3 as a sputter gas supplying means for supplying into a reaction chamber 9 a sputter gas GA for sputtering the target 1, a gas shower head 4 as a reactive gas supplying means for supplying a reactive gas GB, and a power source 8 as a power supplying means for supplying a power for generating a plasma 5 by discharge between the target 1 and the substrate 2.

A grid plate 6 as a partition member having a plurality of openings 6a is provided between the target 1 and the substrate 2. In a first space formed between the target 1 and the grid plate 6, sputter gas supply ports 10 for supplying the sputter gas GA to the first space and an exhaust passage 20 for exhausting at least part of the sputter gas from the first space without passing through the openings 6a are provided.

In a second space formed between the substrate 2 and the grid plate 6, reactive gas supply ports for supplying the reactive gas GB to the second space and an exhaust passage 21 for exhausting at least part of the reactive gas from the second space without passing through the openings 6a are further provided.

In this way, the location of the gas supply ports 10 and 11 and the location of the exhaust passages 20 and 21 that function as exhaust vents are determined such that the sputter gas GA and the reactive gas GB do not mutually diffuse as far as possible through the openings 6a of the grid plate 6. Especially in the present embodiment, a communicating opening 24 is provided between the target 1 and the substrate 2 in such a way that it lies across the grid plate 6 so that exhaust passageways that can prevent the above mutual diffusion are formed at the communicating opening 24, which communicates with an exhaust pump.

According to the present embodiment, the flow of the sputter gas and the flow of the reactive gas are separated from each other by the grid plate 6 as the boundary. Thus, the plasma of the sputter gas is confined between the grid plate 6 and the target 1. The plasma particles thus confined preferentially act to sputter the target, can hardly travel over the grid plate 6 to reach the substrate, and hence do not damage the depositing surface on the substrate. On the other hand, the reactive gas is present between the grid plate 6 and the substrate 2, and can hardly pass through the openings of the grid plate 6 to diffuse to the target side. Thus, the reactive gas reacts, on the depositing surface, preferentially with the sputtered constituent atoms of the target, and hence excess or deficiency of the reactive gas component (e.g., oxygen, nitrogen or fluorine) is not caused, so that a good compound thin film can be formed. Also, since the reaction of the target with the reactive gas can be restrained, the sputtering rate of the target can be increased, thus improving the deposition rate.

Other portions of the present embodiment are constituted as described below.

Figure 2:
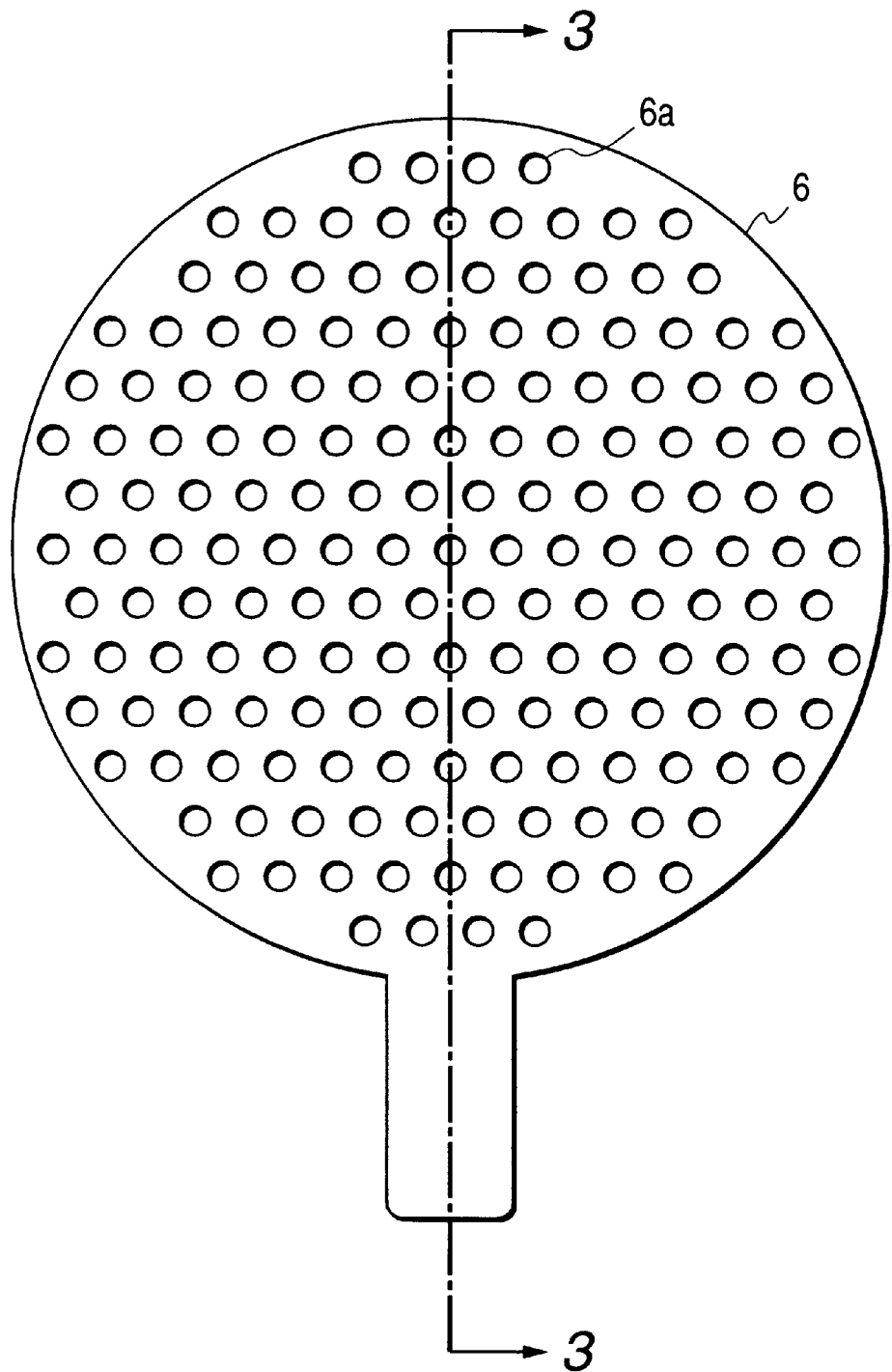
FIG. 2 is a plan view of a partition member used in the reactive sputtering apparatus of the present invention.
Figure 3:
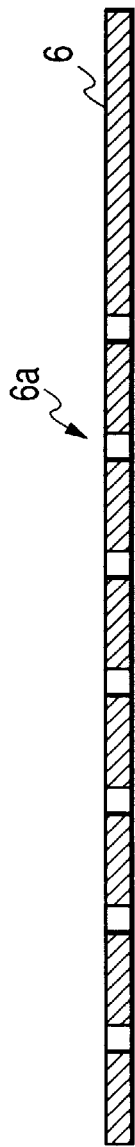
FIG. 3 is a sectional view of the partition member used in the reactive sputtering apparatus of the present invention.

FIG. 2 is a plan view showing an example of the grid plate 6 used in the present invention. FIG. 3 is a sectional view of the grid plate 6 shown in FIG. 2. At least the surface of the grid plate 6 serving as the partition member may preferably be made of a material selected depending on the constituent material of the target 1 to be sputtered. In other words, the material for the grid plate 6 may preferably be selected depending on the constituent material of the film to be formed. For example, in an instance where a silicon oxide film is formed, a member comprised of silicon (Si) is used; in an instance where a tantalum oxide film is formed, a member comprised of tantalum (Ta) is used; and in an instance where an aluminum oxide film is formed, a member comprised of aluminum (Al) is used. Thus, the grid plate material may be selected from silicon, tantalum, aluminum, indium, titanium, copper, tungsten, or the like. The grid plate may be a plate-like member comprising a base member made of a conductive, insulating or semiconductive material as selected regardless of the target material and having formed on at least a surface of the base member facing the target 1 side a film comprised of the same material as the target.

The plurality of openings 6a provided in the grid plate 6 may preferably have an aspect ratio less than 1.0, and more preferably less than 0.6 in all the openings 6a. This enables formation of a film at an appropriate deposition rate and a film can be obtained with a uniform thickness over the whole area. On the other hand, if a conventional collimator is used for this purpose, the collimator has so great an aspect ratio that the sputtered atoms are incident on the substrate surface at small angles, which makes it difficult to form a uniform and large-area continuous film.

The openings may have a three-dimensional shape of cylinders, square columns or the like, as viewed from the top of the grid plate. With regard to the planar shape, i.e., opening shape (two-dimensional shape), the openings may have any shape of circles, ellipses, squares, triangles and so on.

The aspect ratio AR of the openings 6a is defined as a value (D/L) given by dividing a depth D of each opening (plate thickness) by a diameter L of a true circle having the same area as the area of the opening. Further, when the substrate surface has a circular shape, the diameter L may preferably be from 1% to 15%, and more preferably from 4% to 10%, of the diameter of the substrate 2.

In order to form a uniform film, the plurality of openings 6a of the grid plate 6 may preferably be distributed in a regular fashion, and their opening percentage may preferably be from 5% to 90%, and more preferably from 20% to 70%.

The grid plate 6 may preferably be electrically floating, or may more preferably be kept at a predetermined potential so as to produce a potential difference between it and the target, in the state of which the sputtering is carried out. Letter symbol SW denotes a switch serving as a potential switching means for setting the potential of the grid plate 6. The grid plate 6 and the substrate 2 may be set to have either the same potential or different potentials. Also, the grid plate 6 and the reaction chamber may be set to have potentials different from each other. In order to enhance the rate of sputtering, the power supplied may be made higher. If, however, it is done, the sputtered atoms may impinge upon the substrate so much as to cause an excessive rise of the substrate temperature. If so, it is not possible to form a film on those substrates which are subject to thermal deformation. In the present embodiment, since the grid plate partially captures the sputtered atoms, such a problem can be solved. When the grid plate is biased to a positive potential with respect to the target, negative ions are captured by the grid plate to prevent the film from being damaged. When the grid plate is biased to a negative potential with respect to the target, negative ions bounce back to the target side to prevent the film from being damaged.

The sputter gas supply port 10 may preferably be provided in plurality as shown in FIG. 1, in the vicinity of the target 1, so as to surround the target 1. In the apparatus shown in FIG. 1, the sputter gas supply ports 10 are present on the target 1 side with respect to the pipe center to preferentially blow out the gas to the target 1 side. The sputter gas supply ports 10 are arranged at substantially equal intervals on the gas shower head 3 which is a cyclic supply pipe. In other words, a plurality of supply ports are provided symmetrically on a circumference.

Similarly, the reactive gas supply port 11 may also preferably be provided in plurality in the vicinity of the substrate 2 so as to surround the substrate 2. In the apparatus shown in FIG. 1, the reactive gas supply ports 11 are present on the substrate 2 side with respect to the pipe center to preferentially blow out the gas to the substrate side.

The reactive gas supply ports 11 are arranged at substantially equal intervals on the gas shower head 4 which is a cyclic supply pipe. In other words, a plurality of supply ports are provided symmetrically on a circumference.

The substrate holder 7 as the substrate holding means is so constructed as to be rotatable at 1 to 50 rpm during the sputtering. This enables formation of a more uniform film.

A magnet may also be provided at the target holder 12 to carry out the reactive magnetron sputtering. When it is so provided, the sputter gas plasma can be confined more in the vicinity of the target.

As the power source 8, a DC power source or an AC power source is used. The AC power source is exemplified by an RF power source of 13.56 MHz, and a DC bias may be optionally superimposed thereon. When the sputtering rate is increased to more improve the thin film deposition rate, it is preferable to carry out DC sputtering using a DC power source.

The exhaust vent of the reaction chamber 9 is connected to an exhaust pump (not shown). The exhaust pump may be constituted of, for example, a combination of a turbo-molecular pump or cryopump for main exhaust and a rotary pump for rough exhaust.

In the apparatus of the present embodiment, the sputter gas GA is introduced into the space between the target 1 and the grid plate 6, and continually flows through the part 20 that functions as an exhaust vent, defined by the edge of the target 1 and the edge of the grid plate 6, toward the communicating opening 24 as shown by an arrow 22.

On the other hand, the reactive gas GB is introduced into the space between the grid plate 6 and the substrate 2, and continually flows through the part 21 that functions as an exhaust vent, defined by the edge of the substrate 2 and the edge of the grid plate 6, toward the communicating opening 24 as shown by an arrow 23. Since the conductance of such routes is sufficiently greater than the conductance of the openings 6a of the grid plate 6, the mutual diffusion of the both gases through the openings 6a is substantially negligible. Further, the plasma may be confined in the space between the grid plate and the target by cooperatively setting the potential of the grid plate 6, whereby a better thin film can be formed.

(Film Forming Process)

A thin-film forming process that forms a thin film by the use of the reactive sputtering apparatus as described above will be described below.

First, the target 1, the substrate 2 and the grid plate 6 are arranged in the reaction chamber 9 in the manner as shown in FIG. 1. Here, it is desirable to select the same material for the target 1 and the grid plate 6.

First, the grid plate 6 having a plurality of openings is disposed. Then, the target 1 is set on the target holder 12. Subsequently the substrate 2 is set on the substrate holder 7.

The inside of the reaction chamber 9 is evacuated through the communicating opening 24, and the substrate 2 is heated or cooled if necessary.

The sputter gas GA is fed through the supply ports 10 of the gas shower head 3 into the space between the target 1 and the grid plate 6, and the reactive gas GB is fed through the supply ports 11 of the gas shower head 4 into the space between the substrate 2 and the grid plate 6.

The sputter gas GA is exhausted through the exhaust part 20 toward the communicating opening 24, and the reactive gas GB is exhausted through the exhaust part 21 toward the communicating opening 24.

The pressure inside of the reaction chamber is maintained approximately at 0.05 to 13 Pa, and more preferably at 0.1 to 1.3 Pa, in the state of which a DC voltage or RF voltage is applied between the target 1 and the substrate 2 to cause a discharge to take place between the target 1 and the grid plate 6 to form a plasma 5 of the sputter gas. In this state, the formed plasma 5 may extend into the space between the grid plate 6 and the substrate 2 through the openings 6a. Constituent atoms of the target as sputtered with the plasma particles pass through the openings 6a of the grid plate 6 and reach the surface of the substrate 2. Here, since the reactive gas capable of reacting with the target constituent atoms is present in the space between the grid plate 6 and the substrate 2, the both react with each other on the substrate surface, so that a film containing the target constituent atoms and the reactive gas constituent atoms can be formed on the substrate.

When the grid plate 6 is constituted of the same material as the target 1, the thin film formed on the substrate 2 is not affected even if the plasma particles have sputtered the grid plate 6. Also, since the grid plate 6 and the exhaust parts 20 and 21 can prevent the reactive gas from flowing out to the target side, the reaction of the reactive gas with the sputtered constituent atoms of the target takes place preferentially on the substrate surface. Thus, the sputtering rate does not lower, and a thin film that satisfies the stoichiometric ratio can be formed at a high deposition rate.

The surface materials for the target and for the partition member used in the present invention may be selected from Si, Mg, Al, Ta, In, Sn, Ti, Cu, Zn and W.

The sputter gas may be selected from He, Ne, Ar, Kr, Xe, or the like.

The reactive gas may be selected from $O_2$, $O_3$, $N_2$, $F_2$, $NF_3$, or the like.

The substrate may be either light-transmitting or non-light-transmitting, and the materials for the substrate may be selected from semiconductor materials such as silicon, GaAs, etc., insulating materials such as glass, quartz, fluorite, etc., and metallic materials such as stainless steel, aluminum, etc.

Thin films that can be formed according to the present embodiment are silicon oxide films, aluminum oxide films, tantalum oxide films, indium oxide films, tin oxide films, titanium nitride films, copper oxide films, zinc oxide films, tungsten nitride films, magnesium fluoride films, aluminum fluoride films and so forth.

The reactive sputtering apparatus of the present invention is effective especially when an optical thin film is formed on a concave or convex surface of a light-transmitting insulating substrate. The optical thin films obtained by the thin film forming process of the present invention exhibit superior characteristics as reflection preventive films or reflection enhancing films for KrF excimer laser and ArF excimer laser optical systems having a high energy.

(Other Embodiments)

When films of different compositions are formed using the same reactive sputtering apparatus, the grid plate as the partition member may preferably be exchangeable.

Figure 4:
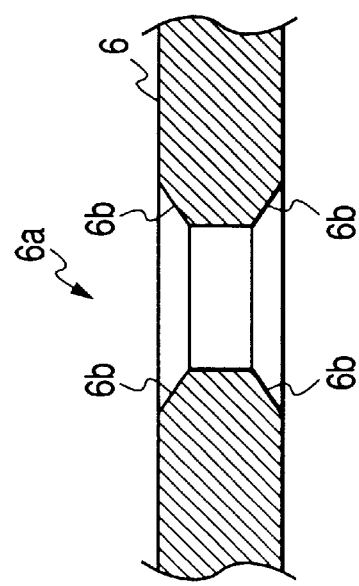
FIG. 4 is a sectional view of a portion of another partition member used in the present invention.

There are cases where sputtered atoms may adhere onto a surface of the grid plate, especially where they may adhere to the corners of openings on the target side to stop up the openings. Accordingly, the corners of the openings may preferably be bevelled into a tapered shape so as not to fill up the openings. FIG. 4 is a partial cross section showing such a tapered opening 6a of the grid plate 6. As can be clearly seen when compared with FIG. 3, corners 6b are bevelled.

Another preferred embodiment of the present invention will be described below.

Figure 5:
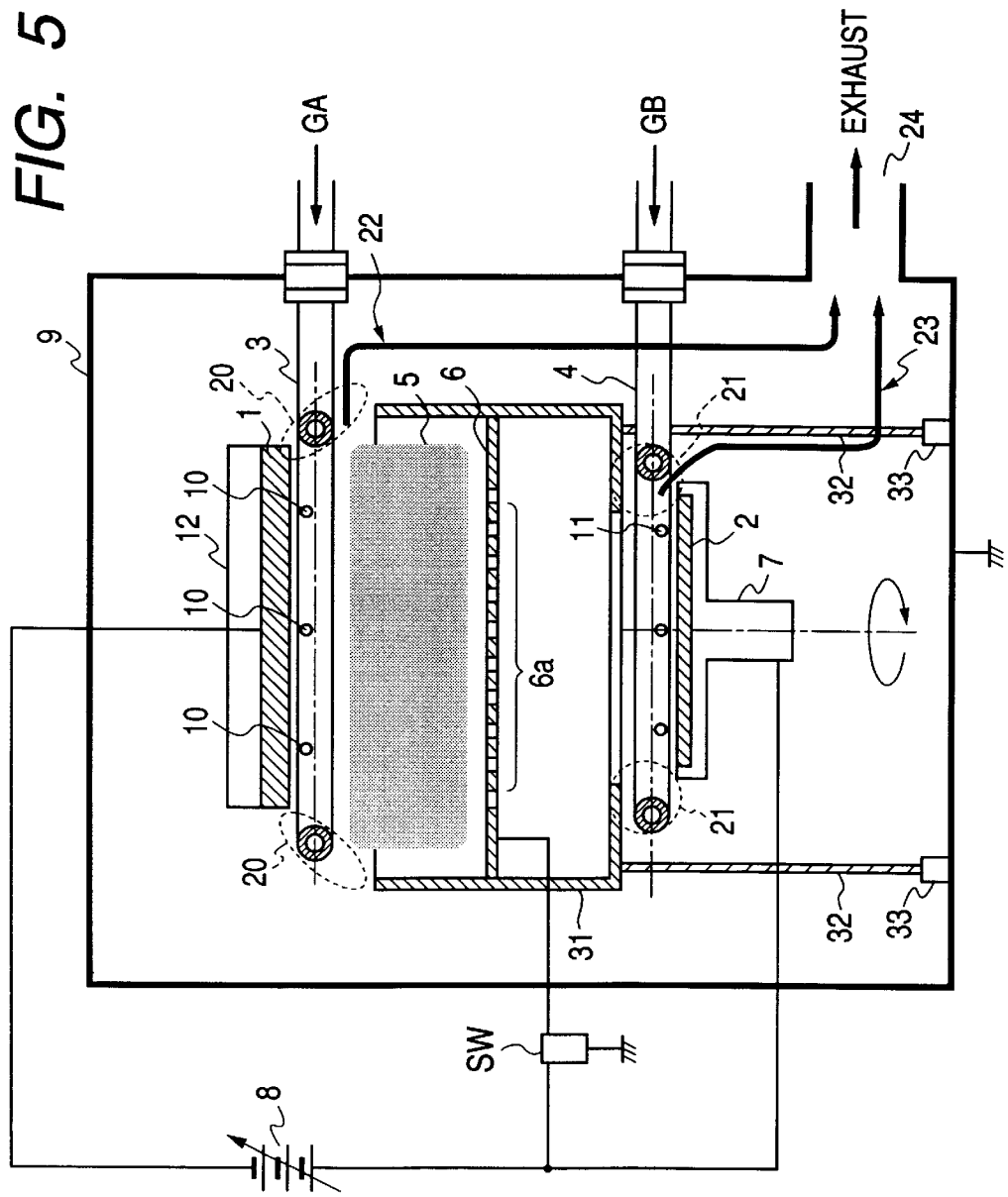
FIG. 5 is a schematic view showing a reactive sputtering apparatus according to another embodiment of the present invention.

FIG. 5 shows a modification of the above embodiment shown in FIG. 1, where a shielding member 31 of a cylinder shape is provided around the grid plate 6. The shielding member 31 has the function as a deposition preventing plate for preventing the sputtered target constituent atoms from depositing onto the inner walls of the reaction chamber and the function to improve the effect of confining the sputter gas and the effect of confining the reactive gas. In the present embodiment, the gap between the upper edge of the shielding member 31 and the target 1 forms the exhaust part 20, and the gap between the shielding member 31 and the gas shower head 4 and that between the gas shower head 4 and the substrate 2 form the exhaust part 21. The sputter gas GA flows toward the communicating opening 24 through the route as shown by an arrow 22. The reactive gas GB flows toward the communicating opening 24 through the route as shown by an arrow 23. Since the conductance of the routes 22 and 23 is made sufficiently greater than the conductance of the openings 6a of the grid plate 6, the mutual diffusion that may adversely affect the film formation can be restrained.

The shielding member 31 may preferably be formed of the same material as the grid plate 6. Further, the potential thereof may also preferably be kept at the same potential state as the grid plate 6 as the partition member. The shielding member 31 is supported by supporting legs 33 set on insulators 33 as insulating members provided on the bottom surface of the reaction chamber. As the switch SW, a switch may be used which is constituted in the same manner as, or constituted to have the function equivalent to, the switch SW shown in FIG. 1.

The portions and constitution of the apparatus of the embodiment shown in FIG. 5 are the same as those of the apparatus shown in FIG. 1 except for the differences as described above.

Figure 6:
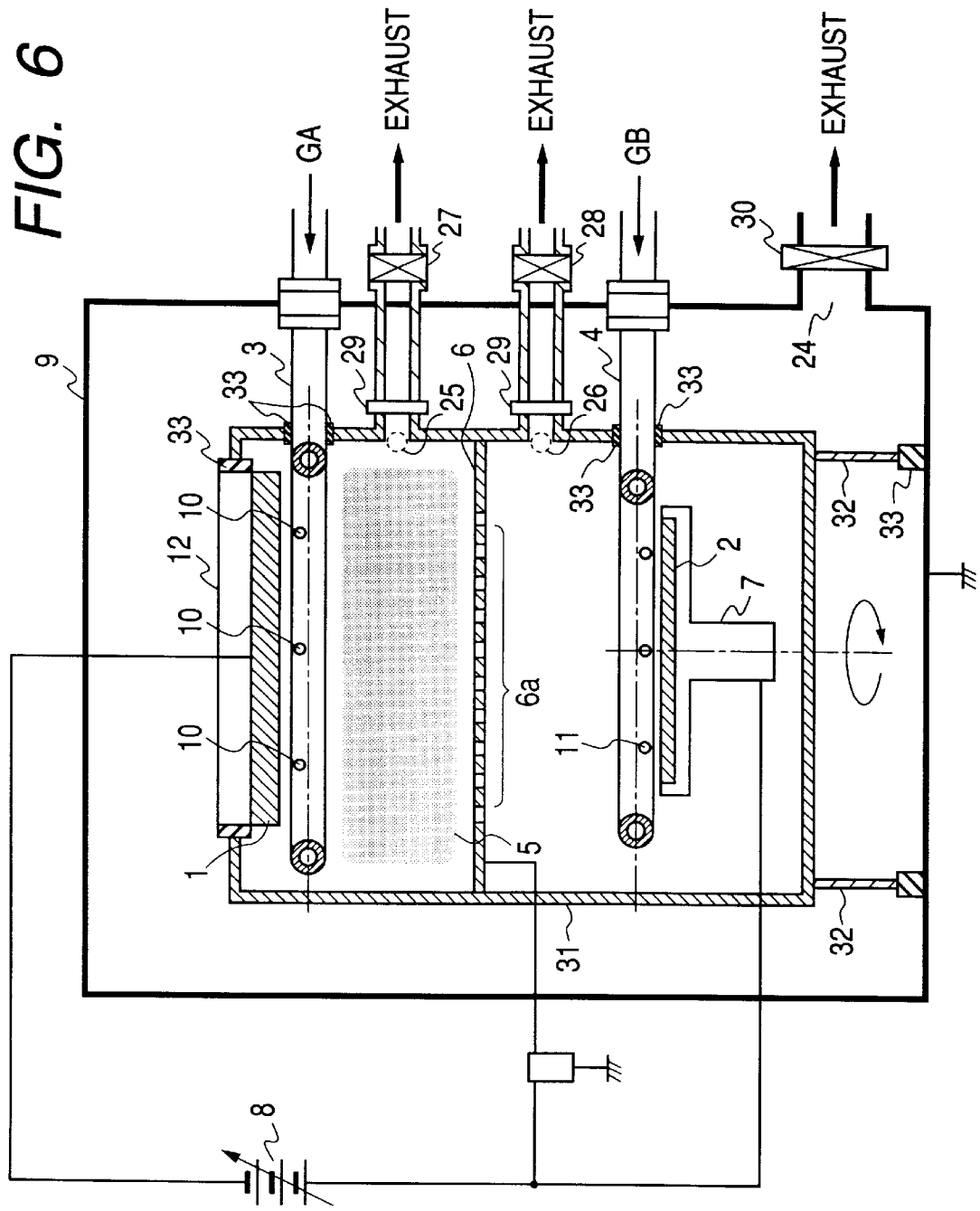
FIG. 6 is a schematic view showing a reactive sputtering apparatus according to still another embodiment of the present invention.

FIG. 6 is a schematic view illustrating still another embodiment of the present invention. The present embodiment is characterized by being provided with a communicating opening 25 exclusively used for exhausting the sputter gas for exhaust of the space between the grid plate 6 and the target 1 and also with a communicating opening 26 exclusively used for exhausting the reactive gas for exhaust of the space between the grid plate 6 and the substrate 2.

To the shielding member 31 above the grid plate 6 is connected an exhaust pipe to form a communicating opening 25 as an exhaust passage. Reference numeral 27 denotes a valve, by means of which the exhaust route can be opened or closed and its conductance can be adjusted.

To the shielding member 31 below the grid plate 6 is connected another exhaust pipe to form a communicating opening 26 as an exhaust passage. Reference numeral 28 denotes a valve, by means of which the exhaust route can be opened or closed and its conductance can be adjusted.

The two exhaust routes are provided midway with insulators 29 as insulating members so that the reaction chamber is insulated from the shielding member.

Furthermore, the reaction chamber 9 also is provided with a communicating opening 24, as with the apparatus shown in FIG. 5. Exhaust can be effected by opening a valve 30 during film formation.

In the present embodiment, the pressure at which the sputter gas is exhausted from the communicating opening 25 may preferably be made higher than the pressure at which the reactive gas is exhausted from the communicating opening 26 so that the pressure in the plasma-producing space can be higher than the space on the substrate side. This makes it much harder for the reactive gas to flow into the plasma-producing space. Stated specifically, valves 27, 28 and 30 are opened to evacuate the inside of the reaction chamber. Next, the valve 30 is closed to change the exhaust route and to simultaneously introduce the sputter gas and the reactive gas into the reaction chamber through the gas shower heads 3 and 4, respectively. Thus, the sputter gas is introduced into the first space through the supply ports 10, and is exhausted from the first space through the communicating opening 25. The reactive gas is introduced into the second space through the supply ports 11, and is exhausted from the second space through the communicating opening 26. As the switch SW, a switch may be used which is constituted in the same manner as, or constituted to have the function equivalent to, the switch SW shown in FIG. 1.

The portions and constitution of the apparatus of the embodiment shown in FIG. 6 are the same as those of the apparatus shown in FIG. 1 except for the differences as described above.

According to the present embodiment, incorporation of unwanted impurities can be restrained, and a compound thin film can be formed which has in-plane uniform thickness and optical and electrical characteristics.

Figure 7:
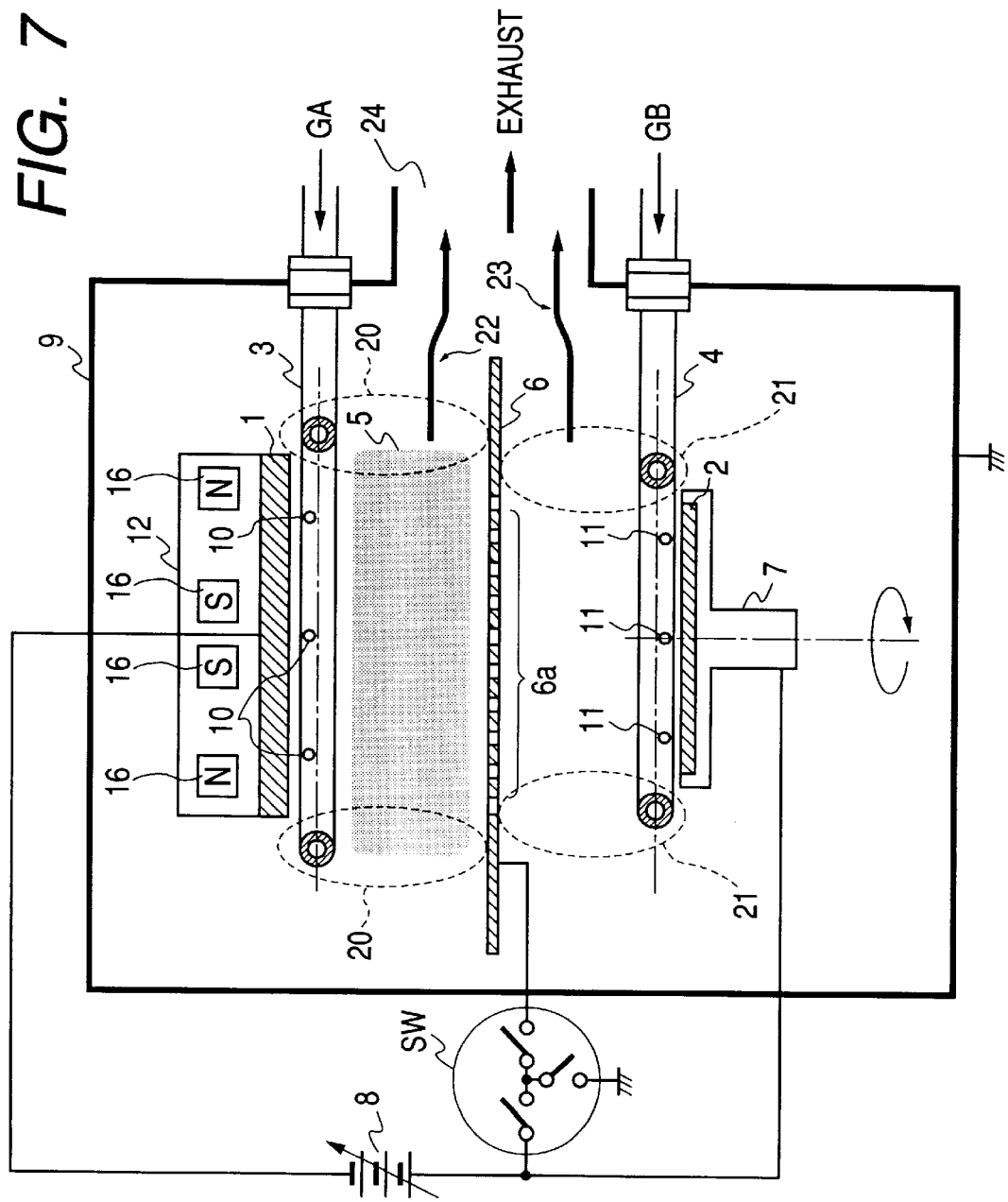
FIG. 7 is a schematic view showing a reactive sputtering apparatus according to yet another embodiment of the present invention.
Figure 8:
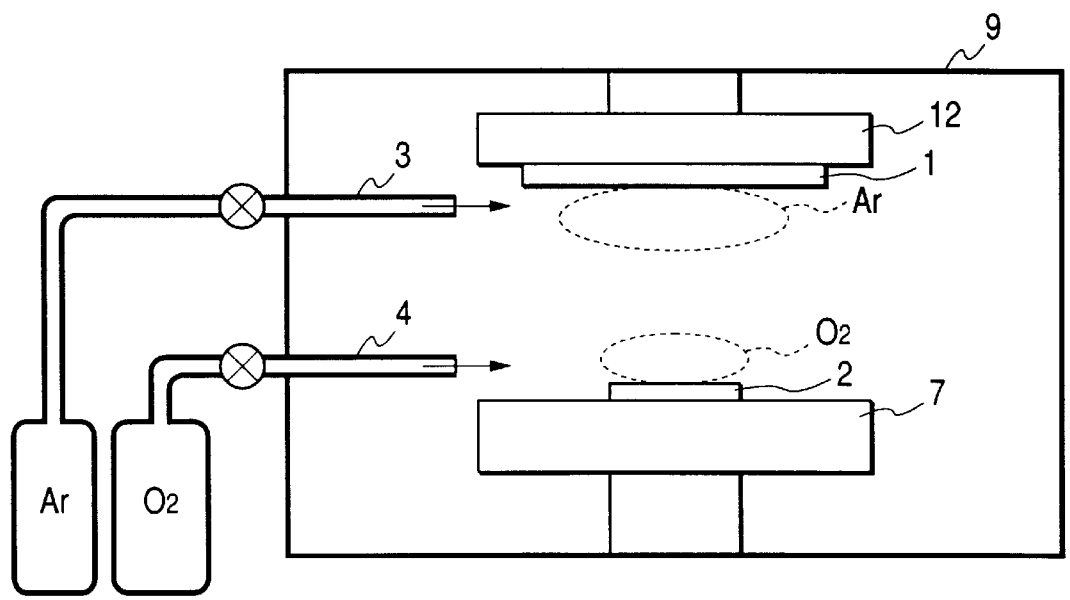
FIG. 8 is a schematic view showing an example of a conventional reactive sputtering apparatus.
Figure 9:
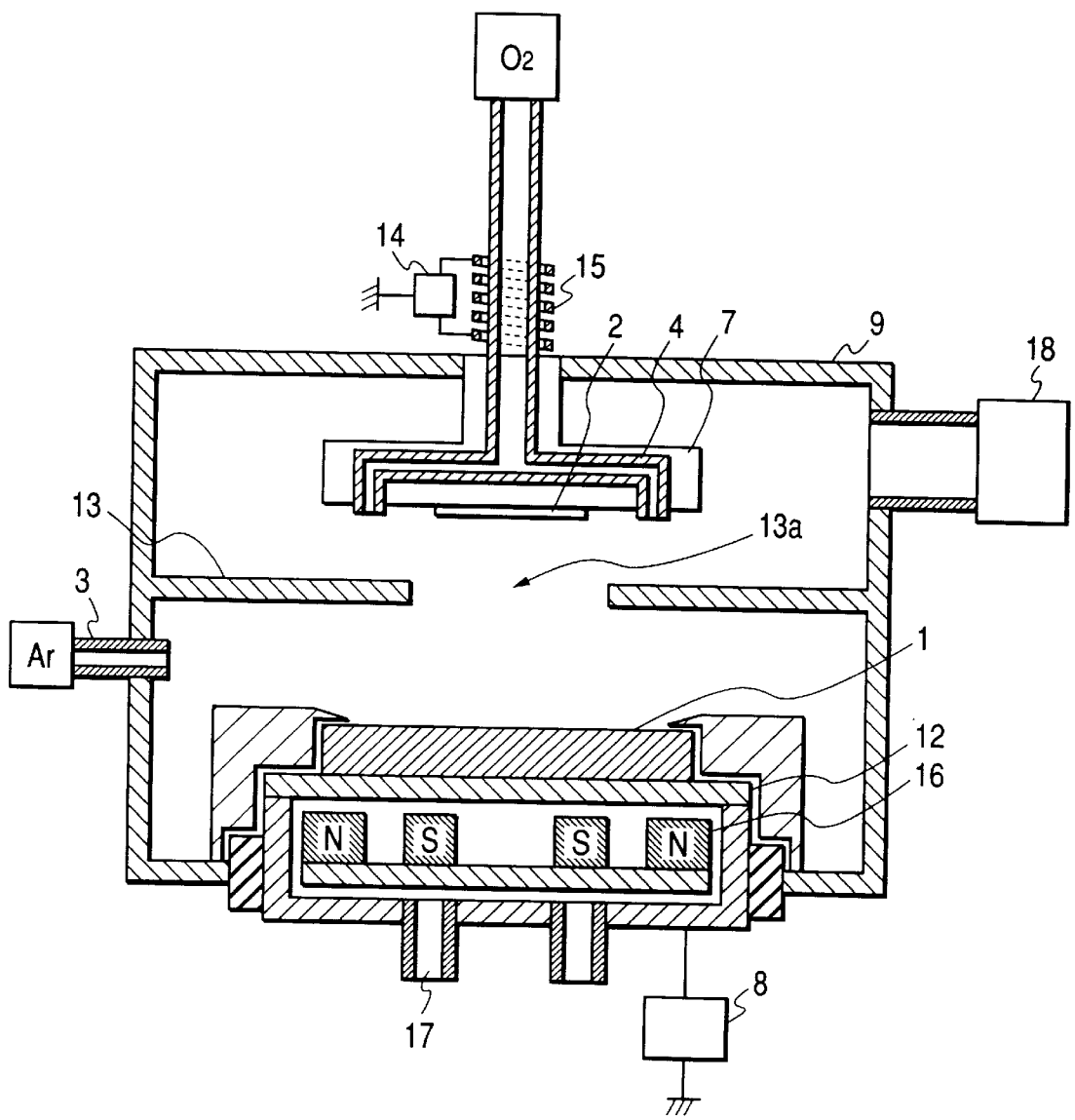
FIG. 9 is a schematic view showing another example of a conventional reactive sputtering apparatus.

A further embodiment of the present invention will be described below with reference to FIG. 7.

The reactive sputtering apparatus according to this embodiment is a modification in part of the apparatus shown in FIG. 1.

The apparatus is modified in that the edge of the grid plate 6 not provided with the openings 6a is extended so that the performance to separate and exhaust the sputter gas and the reactive gas can be improved, and also in that the communicating opening 24 provided in the wall of the reaction chamber 9 is made to have a larger diameter than that shown in FIG. 1 so that the communicating opening 24 can have a higher conductance.

In addition, in order to generate a magnetron discharge, magnets 16 as a magnetic field generating means are provided in the target holder 12. The other constitution is as described for the case of FIG. 1.

According to the present embodiment, by using a partition member having an area larger than those of the target and substrate and having provided a plurality of openings in the vicinity of the center thereof, the two kinds of different gases can be separated and exhausted in a higher efficiency.

According to the present invention, incorporation of unwanted impurities can be restrained, and the thickness and optical and electrical characteristics of the thin film can be made uniform in the substrate plane. In addition, a uniform, large-area compound thin film can be formed at a high deposition rate.

What is claimed is:

1. A reactive sputtering apparatus comprising:
   a substrate holder for holding a substrate;
   a target holder for holding a target;
   a sputter gas supply for supplying into a reaction chamber a sputter gas for sputtering the target;
   a reactive gas supply for supplying a reactive gas;
   a power source for generating a discharge between the target and the substrate;
   a partition member having a plurality openings having an aspect ratio of less than 0.6 provided between the target and the substrate;
   a shielding member provided around the partition member;
   a first space inside the shielding member formed between the target and the partition member;
   a second space inside the shielding member formed between the substrate and the partition member;
   a sputter gas supply port for supplying the sputter gas to the first space inside the shielding member;
   an exhaust passage for exhausting at least part of the sputter gas from the first space inside the shielding member without passing through the plurality of openings;
   a reactive gas supply port for supplying the reactive gas to the second space inside the shielding member; and
   an exhaust passage for exhausting at least part of the reactive gas from the second space inside the shielding member without passing through the plurality of openings.

2. The reactive sputtering apparatus according to claim 1, wherein the exhaust passage for the reactive gas is a gap between a supply pipe for the reactive gas and the substrate.

3. The reactive sputtering apparatus according to claim 1, wherein an exhaust port for exhaust of the inside of the reaction chamber, an exhaust port for exhaust of the first space and an exhaust port for exhaust of the second space are provided separately from one another.

4. The reactive sputtering apparatus according to claim 1, wherein at least a surface of the partition member is comprised of the same material as that of the target.

5. The reactive sputtering apparatus according to claim 1, wherein the partition member and the shielding member are constituted of the same material.

6. The reactive sputtering apparatus according to claim 1, wherein the partition member is a plate-like member having the plurality of openings distributed in a pattern.

7. The reactive sputtering apparatus according to claim 1, wherein the partition member has a surface of a material selected from aluminum, tantalum, silicon and magnesium.

8. The reactive sputtering apparatus according to claim 1, wherein the sputter gas supply port is provided in plurality in the vicinity of the target so as to surround the target, and wherein the reactive gas supply port is provided in plurality in the vicinity of the substrate so as to surround the substrate.

9. The reactive sputtering apparatus according to claim 1, wherein the partition member is made electrically floating.

10. The reactive sputtering apparatus according to claim 1, wherein the partition member is kept at a predetermined potential.

11. The reactive sputtering apparatus according to claim 1, wherein the substrate holding means is in-plane rotatable.

12. A thin film forming process for forming a thin-film using a reactive sputtering apparatus comprising a substrate holder for holding a substrate, a target holder for holding a target, a sputter gas supply for supplying into a reaction chamber a sputter gas for sputtering the target, a reactive gas supply for supplying a reactive gas, a power source for generating a discharge between the target and the substrate, a partition member having a plurality of openings having an aspect ratio of less than 0.6, and a shielding member provided around the partition member, the process comprising the steps of:

disposing the substrate and the target such that the partition member is interposed therebetween;

supplying the sputter gas to a first space inside the shielding member between the target and the partition member and exhausting at least part of the sputter gas from the first space inside the shielding member without passing through the plurality of openings;

supplying the reactive gas to a second space inside the shielding member between the substrate and the partition member and exhausting at least part of the reactive gas from the second space inside the shielding member without passing through the plurality of openings; and generating a discharge between the target and the substrate, thereby forming on the substrate a thin film containing constituent atoms of the target and constituent atoms of the reactive gas.

13. The thin-film forming process according to claim 12, wherein the target comprises a material selected from aluminum, tantalum and silicon.

14. The thin-film forming process according to claim 12, wherein the substrate is a light-transmitting insulating substrate.

15. The thin-film forming process according to claim 12, wherein the sputter gas is at least one gas selected from He, Ar, Ne, Kr and Xe.

16. The thin-film forming process according to claim 12, wherein the reactive gas is at least one of oxygen gas, nitrogen gas and fluorine gas.

17. The thin-film forming process according to claim 12, wherein the substrate is a light-transmitting insulating substrate having a concave or convex surface.

* * * * *

UNITED STATES PATENT AND TRADEMARK OFFICE
CERTIFICATE OF CORRECTION

PATENT NO.     : 6,200,431 B1
DATED          : March 13, 2001
INVENTOR(S)    : Kazuho Sone It is certified that error appears in the above-identified patent and that said Letters Patent is hereby corrected as shown below:

<u>Title page,</u>
Item [56], U.S. PATENT DOCUMENTS, "Mikaloon et al." should read
-- Mikalesen et al. --.

<u>Column 7,</u>
Line 26, "the both" should read -- they both --.

<u>Column 10,</u>
Line 10, "openings" should read -- of openings --.

Signed and Sealed this

Twenty-second Day of July, 2003

JAMES E. ROGAN
*Director of the United States Patent and Trademark Office*